(12) United States Patent
Takata et al.

(10) Patent No.: US 7,501,038 B2
(45) Date of Patent: Mar. 10, 2009

(54) ASSEMBLING APPARATUS, ASSEMBLING METHOD AND TERMINAL CLEANING APPARATUS

(75) Inventors: Hidehiko Takata, Kasuga (JP); Kouki Iwakawa, Fukuoka (JP)

(73) Assignee: Panasonic Corporation, Osaka (JP)

( * ) Notice: Subject to any disclaimer, the term of this patent is extended or adjusted under 35 U.S.C. 154(b) by 176 days.

(21) Appl. No.: 10/942,516

(22) Filed: Sep. 16, 2004

(65) Prior Publication Data
US 2005/0066522 A1  Mar. 31, 2005

(30) Foreign Application Priority Data
Sep. 26, 2003  (JP)  ............ P.2003-335262

(51) Int. Cl.
*B32B 37/00*  (2006.01)
(52) U.S. Cl. ............ 156/281; 134/66; 156/535
(58) Field of Classification Search ........ 156/281; 134/66, 62, 92
See application file for complete search history.

(56) References Cited
U.S. PATENT DOCUMENTS 2,872,693 A * 2/1959 Anderson et al. ............ 15/88.3
5,176,783 A * 1/1993 Yoshikawa ............. 156/345.15
5,439,015 A * 8/1995 Shibano ........................ 134/66

FOREIGN PATENT DOCUMENTS

JP  2002-050655  2/2002

\* cited by examiner

*Primary Examiner*—Mark A Osele
(74) *Attorney, Agent, or Firm*—Pearne & Gordon LLP

(57) ABSTRACT

A terminal cleaning apparatus integrated to an assembling apparatus for integrating a display panel by bonding an electronic part to an externally connecting terminal of a substrate in which substrates 5 respectively held by a first substrate holding portion 24 and a second substrate holding portion 25 moved by an XY table mechanism 23 are made to pass through a first cleaning portion 21 and a second cleaning portion 22 having different cleaning means to simultaneously clean and the substrate which is not cleaned is carried in and the substrate 5 is transferred between the substrate holding portions and the substrate 5 which has been cleaned is carried out simultaneously by a first substrate transferring mechanism 26. Thereby, an operational efficiency of a step of cleaning an externally connecting terminal can be improved by making substrate carrying operation efficient.

11 Claims, 11 Drawing Sheets

A-A SECTION

B-B SECTION

C-C ARROW VIEW

ASSEMBLING APPARATUS, ASSEMBLING METHOD AND TERMINAL CLEANING APPARATUS

The present invention relates to an assembling apparatus and an assembling method for bonding electronic parts to integrate to a substrate of a liquid crystal display panel or the like as well as a terminal cleaning apparatus for cleaning an externally connecting terminal of the substrate.

In an assembling apparatus of integrating a display panel by bonding an electronic part to a glass substrate, an externally connecting terminal formed at an edge portion of the substrate is bonded with an electronic part of a semiconductor chip, a flexible substrate or the like. A method of using an adhering tape of an anisotropic conducting member or the like is used as the method of bonding. In bonding, in order to enhance adhesion of the adhering tape, cleaning is needed for removing a foreign matter adhered to a surface of the externally connecting terminal.

Therefore, there is used an assembling apparatus of a display panel having a constitution connected with a terminal cleaning apparatus for cleaning a terminal as a front-end process apparatus of a mounting apparatus for mounting an electronic part to a substrate (for example, JP-A-2002-50655). According to the reference, a substrate provided with a terminal, which is an object of cleaning, is successively passed to a plurality of kinds of cleaning means (for example, air blow cleaning, wiping cleaning and atmospheric pressure plasma cleaning) to thereby ensure an excellent cleaning result.

However, according to the above-described conventional art, substrate carrying means for carrying in and carrying out the substrate to and from the plurality of kinds of cleaning means arranged in series is constituted to serve also as cleaning and moving means for moving the substrate in the respective cleaning means. Therefore, a successive substrate cannot be carried in until one sheet of substrate is finished to clean and is carried out to outside of the apparatus, and it is difficult to improve an operational efficiency of the cleaning step, which constitutes a factor of hampering shortening of cycle time of a assembling operation.

SUMMARY OF THE INVENTION

Hence, it is an object of the invention to provide an assembling apparatus and an assembling method as well as a terminal cleaning apparatus capable of shortening cycle time of a assembling operation by improving an operational efficiency of a cleaning step of an externally connecting terminal.

An assembling apparatus of the invention includes a terminal cleaning means for cleaning an externally connecting terminal of a substrate, an adhering tape attaching means for attaching an adhering tape to the terminal cleaned by the terminal cleaning means, and an electronic part bonding means for bonding an electronic part to the substrate in a state of pressing an electrode of the electronic part from above the adhering tape attached to the substrate to electrically conduct the electrode and the terminal, wherein the terminal cleaning means includes a first cleaning portion for cleaning the terminal of the substrate, a second cleaning portion arranged at a position remote from the first cleaning portion in a first direction for cleaning the terminal of the substrate by a means different from a means of the first cleaning portion, a first substrate holding portion and a second substrate holding portion arranged at a position remote from a position of the first substrate holding portion in the first direction, a substrate holding portion moving means for passing the substrate held by the first substrate holding portion through the first cleaning portion to clean the substrate by the first cleaning portion and passing the substrate held by the second substrate holding portion through the second cleaning portion to clean the substrate by the second cleaning portion, and a substrate carrying means for transferring the substrate which is not cleaned to the first substrate holding portion, transferring the substrate cleaned by the first cleaning portion from the first substrate holding portion to the second substrate holding portion and carrying out the substrate cleaned by the second cleaning portion from the second substrate holding portion.

An assembling method of the invention includes a terminal cleaning step of cleaning an externally connecting terminal of a substrate, an adhering tape attaching step of attaching an adhering tape to the terminal cleaned by the terminal cleaning step, and an electronic part bonding step of pressing an electrode of an electric part from above the adhering tape attached to the substrate to bond the electronic part to the substrate in a state of electrically conducting the electrode and the terminal, wherein in the terminal cleaning step, the substrates are held by a first substrate holding portion and a second substrate holding portion arranged at a position remote from the first substrate holding portion in a first direction, the substrate held by the first substrate holding portion is made to pass through the first cleaning portion to clean the substrate by the first cleaning portion, the substrate held by the second substrate holding portion is made to pass through the second cleaning portion to clean the substrate by the second cleaning portion, the substrate cleaned by the second cleaning portion is carried out from the second substrate holding portion, the substrate cleaned by the first cleaning portion is transferred from the first substrate holding portion to the second substrate holding portion, and the substrate which is not cleaned is transferred to the first substrate holding portion.

A terminal cleaning apparatus of the invention is a terminal cleaning apparatus for cleaning an externally connecting terminal of a substrate, the terminal cleaning apparatus comprising a first cleaning portion for cleaning the terminal of the substrate, a second cleaning portion arranged at a position remote from a position of the first cleaning portion in a first direction for cleaning the terminal of the substrate by a means different from a means of the first cleaning portion, a first substrate holding portion and a second substrate holding portion arranged at a position remote from the first substrate holding portion in the first direction, a substrate holding portion moving means for passing the substrate held by the first substrate holding portion through the first cleaning portion to clean the substrate by the first cleaning portion and passing the substrate held by the second substrate holding portion through the second cleaning portion to clean the substrate by the second cleaning portion, and a substrate carrying means for transferring the substrate which is not cleaned to the first substrate holding portion, transferring the substrate cleaned by the first cleaning portion from the first substrate holding portion to the second substrate holding portion and carrying out the substrate which cleaned by the second cleaning portion from the second substrate holding portion.

According to the invention, cycle time of integrating operation can be shortened by improving an operational efficiency of the step of cleaning the externally connecting terminal by holding the substrates respectively by the first substrate holding portion and the second substrate holding portion, passing the substrate held by the first substrate holding portion through the first cleaning portion to clean the substrate by the first cleaning portion, passing the substrate held by the second substrate holding portion through the second cleaning portion to clean the substrate by the second cleaning portion, and simultaneously carrying out the substrate which has been finished to clean by the second cleaning portion, transferring the substrate which has been finished to clean by the first cleaning portion from the first substrate holding portion to the second substrate holding portion and transferring the substrate which is not cleaned to the first substrate holding portion in the terminal cleaning step.

DETAILED DESCRIPTION OF THE PREFERRED EMBODIMENTS

An explanation will be given of embodiments of the invention in reference to the drawings as follows.

Figure 1:
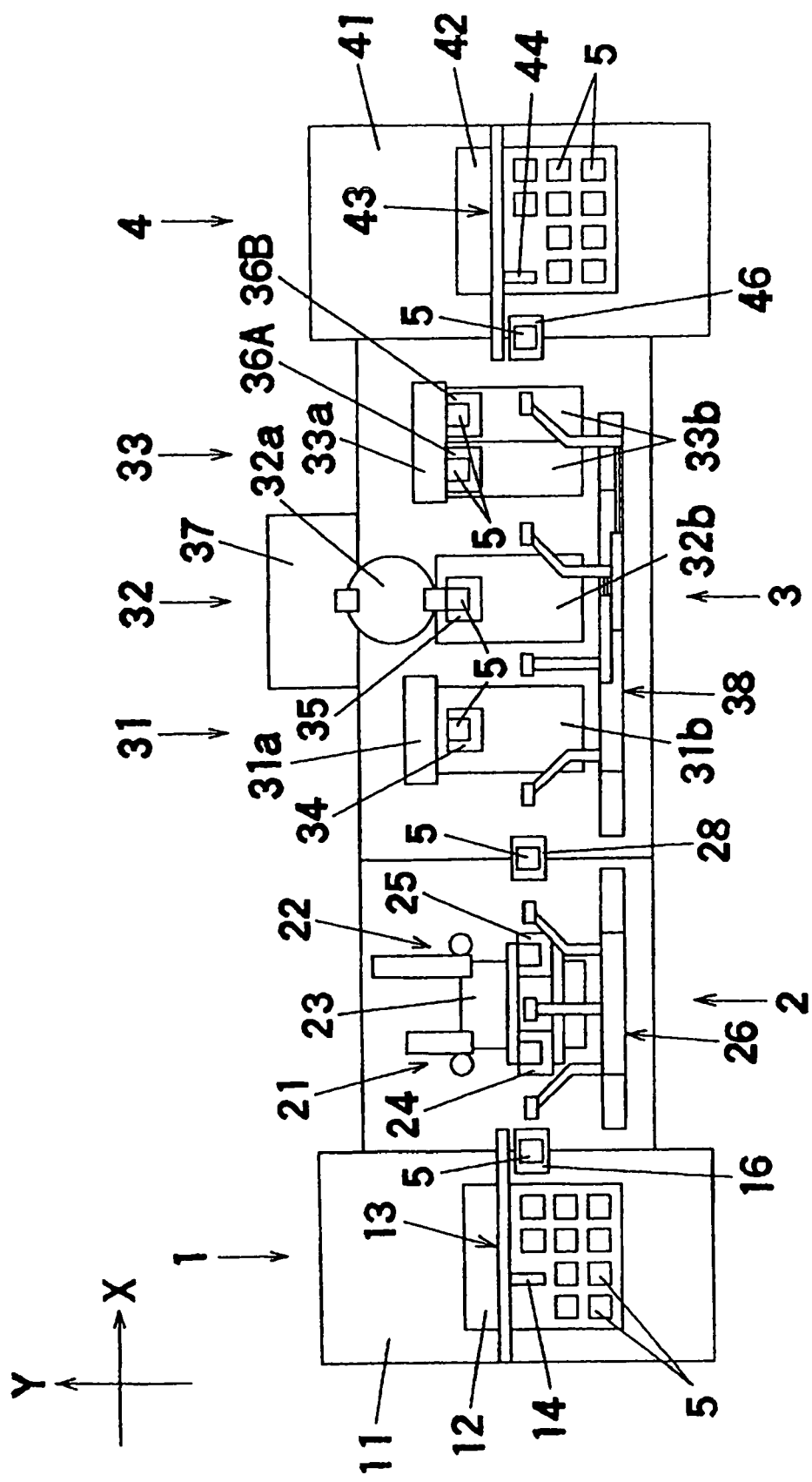
FIG. 1 is a plane view of an assembling apparatus according to an embodiment of the invention.

First, an explanation will be given of a total constitution of an assembling apparatus used in a display panel assembling operation for bonding an electronic part to a glass substrate in reference to FIG. 1. In FIG. 1, the assembling apparatus is constructed by arrangement in series with a substrate supply portion 1, a terminal cleaning apparatus 2, an electronic part bonding apparatus 3, and a substrate recovery portion 4 successively from an upstream side (left side of FIG. 1). According to the display panel assembling operation, a glass substrate 5 (hereinafter, abbreviated simply as "substrate") constituting a main body of a display panel is taken out from the substrate supply portion 1, an externally connecting terminal provided at an edge portion of the substrate 5 is cleaned by the terminal cleaning apparatus 2 and thereafter, an electronic part of a semiconductor device or the like for a driver is bonded to the terminal cleaned by terminal cleaning means by the electronic part bonding apparatus 3 to thereby integrate a display panel. Constitutions of the respective portions will be explained as follows.

First, the constitution of the substrate supply portion 1 for supplying the substrate 5 will be explained. A tray 12 containing the substrate 5 before being integrated is mounted on a base 11, and a substrate moving and mounting portion 13 having a substrate supply head 14 is arranged above the tray 12. The substrate supply head 14 takes out the substrates 5 aligned in a shape of a lattice at the tray to mount the substrates 5 on a supply standby stage 16 provided between the substrate supply portion 1 and the terminal cleaning apparatus 2.

The terminal cleaning apparatus 2 includes two cleaning portions of a first cleaning portion 21, and a second cleaning portion 22. The first cleaning portion 21 disposed on an upstream side cleans the terminal provided at the edge portion of the substrate 5 carried in from the supply standby stage 16. The second cleaning portion 22 is arranged at a position remote from the first cleaning portion 21 in a first direction to clean the terminal of the substrate 5 by a means different from that of the first cleaning portion 21. Therefore, the terminal cleaning apparatus 2 constitutes a terminal cleaning means for cleaning the externally connecting terminal of the substrate 5.

An XY table mechanism 23 is arranged on this side of the first cleaning portion 21, and the second cleaning portion 22, and a first substrate holding portion 24, and a second substrate holding portion 25 are provided above the XY table mechanism 23. The substrates 5 are respectively held by the first substrate holding portion 24, and the second substrate holding portion 25. A first substrate carrying mechanism 26 is arranged on this side of the XY table mechanism 23, the substrates 5 constituting an object of cleaning are carried in to the first substrate holding portion 24, and the second substrate holding portion 25 by the first substrate carrying mechanism 26, and the substrate 5 as cleaned is carried out to an intermediate standby stage 28 similarly by the first substrate carrying mechanism 26.

The constitution of the electronic part bonding apparatus 3 will be explained. The electronic part bonding apparatus 3 is constituted by an adhering tape attaching portion 31, an electronic part provisional-bonding portion 32, and an electronic part complete-bonding portion 33, and the adhering tape attaching portion 31, the electronic part provisional-bonding portion 32, and the electronic part complete-bonding portion 33 are provided with a substrate holding portion 34, a substrate holding portion 35, a substrate holding portion 36A, and a substrate holding portion 36B respectively holding the substrates 5.

The substrate holding portion 34, the substrate holding portion 35, the substrate holding portion 36A, and the substrate holding portion 36B are moved in a horizontal direction respectively by an XY table mechanism 31b, an XY table mechanism 32b, and an XY table mechanism 33b. Thereby, the substrates 5 held by the respective substrate holding portions are respectively positioned relative to an adhering tape attaching mechanism 31a, an electronic part provisional-bonding mechanism 32a, and an electronic part complete-bonding mechanism 33a, and the following operation is carried out for the respective substrates 5.

The adhering tape attaching mechanism 31a attaches an ACF tape 6 which is an adhering tape for adhering an electronic part to an edge portion 5a (refer to FIG. 7) of the substrate 5 provided with the externally connecting terminal. The electronic part provisional-bonding mechanism 32a mounts an electronic part 7 taken out from an electronic part supply portion 37 on the ACF tape 6 attached by the adhering tape attaching portion 31 to provisionally bond. Further, the electronic part complete-bonding mechanism 33a heats and presses the provisionally bonded electronic part 7 to completely bond.

Therefore, the adhering tape attaching mechanism 31a is an adhering tape attaching means for attaching the adhering tape to the terminal cleaned by the terminal cleaning means, and the electronic part provisional-bonding mechanism 32a and the electronic part complete-bonding mechanism 33a constitute an electronic part bonding means for bonding the electronic part to the substrate 5 in a state of pressing an electrode of the electronic part from above the adhering tape attached to the substrate 5 and electrically conducting the electrode and the terminal.

The electronic part bonding apparatus 3 includes a second substrate carrying mechanism 38 and the second substrate carrying mechanism 38 carries the substrate 5 into the electronic part bonding apparatus 3, carries the substrate 5 at inside of the electronic part bonding apparatus 3 and carries the substrate 5 from the electronic part bonding apparatus 3 to the substrate recovery portion 4. The carried substrate 5 is mounted to a recovery standby stage 46 provided between the electronic part bonding apparatus 3 and the substrate recovery portion 4. A tray 42 for containing the assembled substrate 5 is mounted on a base 41 of the substrate recovery portion 4, and a substrate moving and mounting portion 43 including a substrate recovery head 44 is arranged above the tray 42. The substrate recovery head 44 receives the substrate 5 placed on the recovery standby stage 46 to recover to the tray 42.

Figure 2:
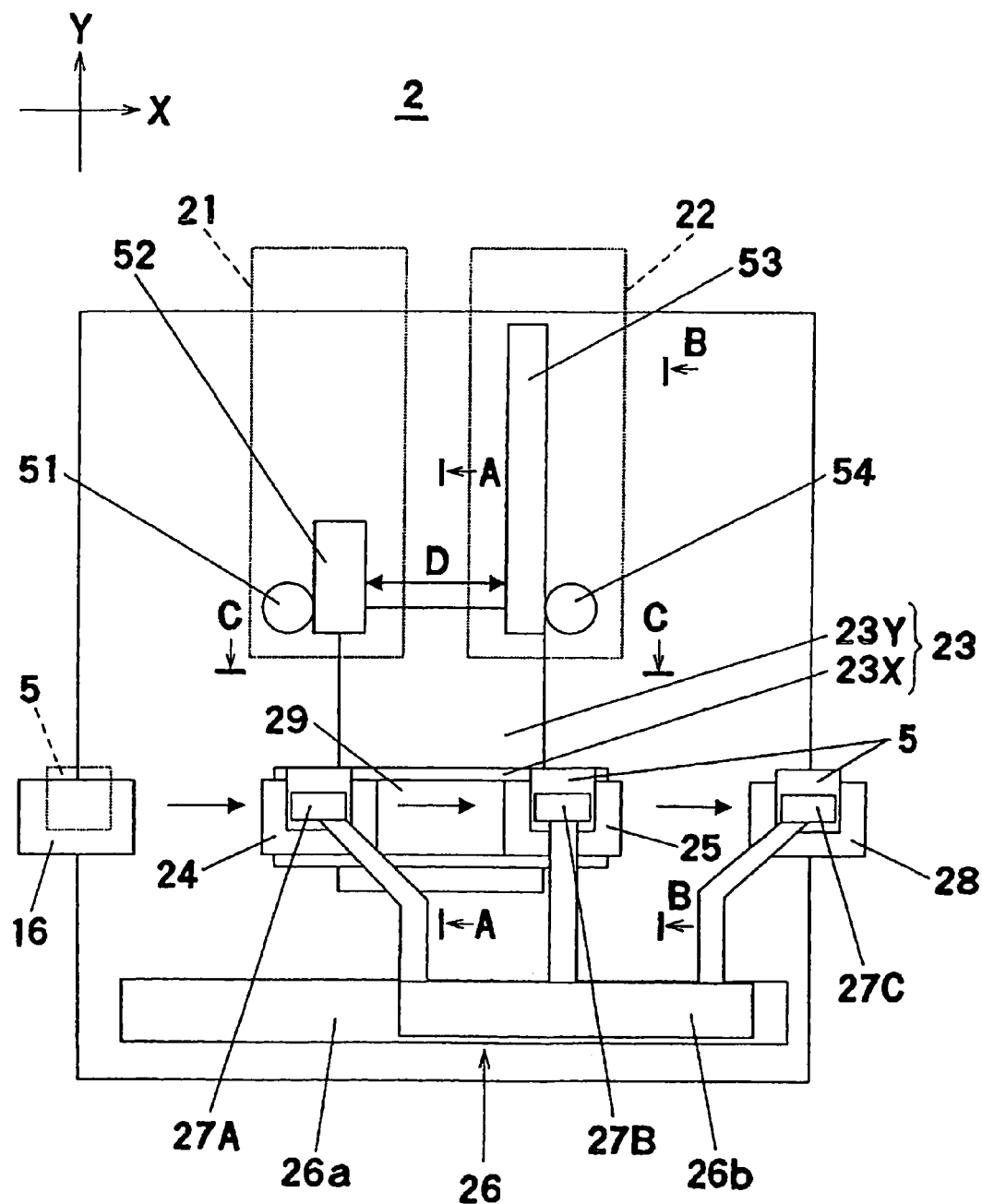
FIG. 2 is a plane view of a terminal cleaning apparatus according to an embodiment of the invention.

Next, a detailed structure of the terminal cleaning apparatus 2 will be explained with reference to FIG. 2. In FIG. 2, the second cleaning portion 22 is arranged at a position remote from the first cleaning portion 21 in X direction (first direction) by a distance D. The first cleaning portion 21 is constructed by combining a first ultrasonic air blow cleaning portion 51 to an atmospheric plasma cleaning portion 52, and the second cleaning portion 22 is constructed by combining a second ultrasonic air blow cleaning portion 54 to a wiping cleaning portion 53.

The XY table mechanism 23 comprising an X-axis table 23X and a Y-axis table 23Y is arranged on this side of the first cleaning portion 21 and the second cleaning portion 22. The first substrate holding portion 24 and the second substrate holding portion 25 arranged at a position remote from the first substrate holding portion 24 in X direction are respectively provided above the XY table mechanism 23 in correspondence with the first cleaning portion 21 and the second cleaning portion 22. The first substrate holding portion 24 and the second substrate holding portion 25 hold the substrates 5 cleaned by respectively passing the first cleaning portion 21 and the second cleaning portion 22.

The first substrate holding portion 24 and the second substrate holding portion 25 are integrally attached by a supporting member 29 and the supporting member 29 is coupled to the XY table mechanism 23 constituting a single substrate holding portion moving mechanism. By driving the XY table mechanism 23, the supporting member 29 is moved to thereby horizontally move both of the first substrate holding portion 24 and the second substrate holding portion 25 attached to the supporting member 29.

Therefore, the XY table mechanism 23 constitutes a substrate holding portion moving means for cleaning the substrate by the first cleaning portion 21 by passing the substrate 5 held by the first substrate holding portion 24 through the first cleaning portion 21, and for cleaning the substrate by the second cleaning portion 22 by passing the substrate 5 held by the second substrate holding portion 25 through the second cleaning portion 22.

The first substrate carrying mechanism 26 is arranged on this side of the XY table mechanism 23. The first substrate carrying mechanism 26 includes a sliding portion 26b capable of being reciprocated along a guiding portion 26a arranged in X direction and front ends of three arms extended from the sliding portion 26b are respectively mounted with substrate holding heads 27A, 27B and 27C from an upstream side.

By moving the sliding portion 26b, the three substrate holding head 27A, 27B, 27C are integrally moved in X direction. Thereby, the substrate holding head 27A transfers the substrate 5 which has not been cleaned and mounted on the supply standby stage 16 to the first substrate holding portion 24, further, the substrate holding head 27B transfers the substrate 5 which has been cleaned by the first cleaning portion 21 and is thereafter mounted on the first substrate holding portion 24 to the second substrate holding portion 25, and the substrate holding head 27C carries the substrate 5 which has been cleaned by the second cleaning portion 27 and is mounted on the second substrate holding portion 25 to mount on the intermediate standby stage 28 provided at a boundary portion between the second terminal cleaning apparatus 2 and the electronic part bonding apparatus 3.

That is, the first substrate transferring mechanism 26 constitutes a substrate carrying means for transferring the substrate 5 which is not cleaned to the first substrate holding portion 24, transferring the substrate 5 which has been finished cleaning by the first cleaning portion 24 from the first substrate holding portion 24 to the second substrate holding portion 25 and carrying out the substrate 5 which has been finished to clean by the second cleaning portion 22 from the second substrate holding portion 25.

Further, the substrate carrying means is constructed by a constitution including the substrate holding head 27A (substrate carrying in head) for transferring the substrate 5 which is not cleaned to the first substrate holding portion 24, the substrate holding head 27B (substrate transferring head) for transferring the substrate 5 which has been finished to clean by the first cleaning portion 21 from the first substrate holding portion 24 to the second substrate holding portion, the substrate holding head 27C (substrate carrying out head) for carrying out the substrate 5 which has been finished to clean by the second cleaning portion 22 from the second substrate holding portion 25, and the guiding portion 26a and the sliding portion 26b (substrate carrying head moving mechanism) for horizontally moving the substrate holding heads 27A, 27B, 27C.

Figure 3:
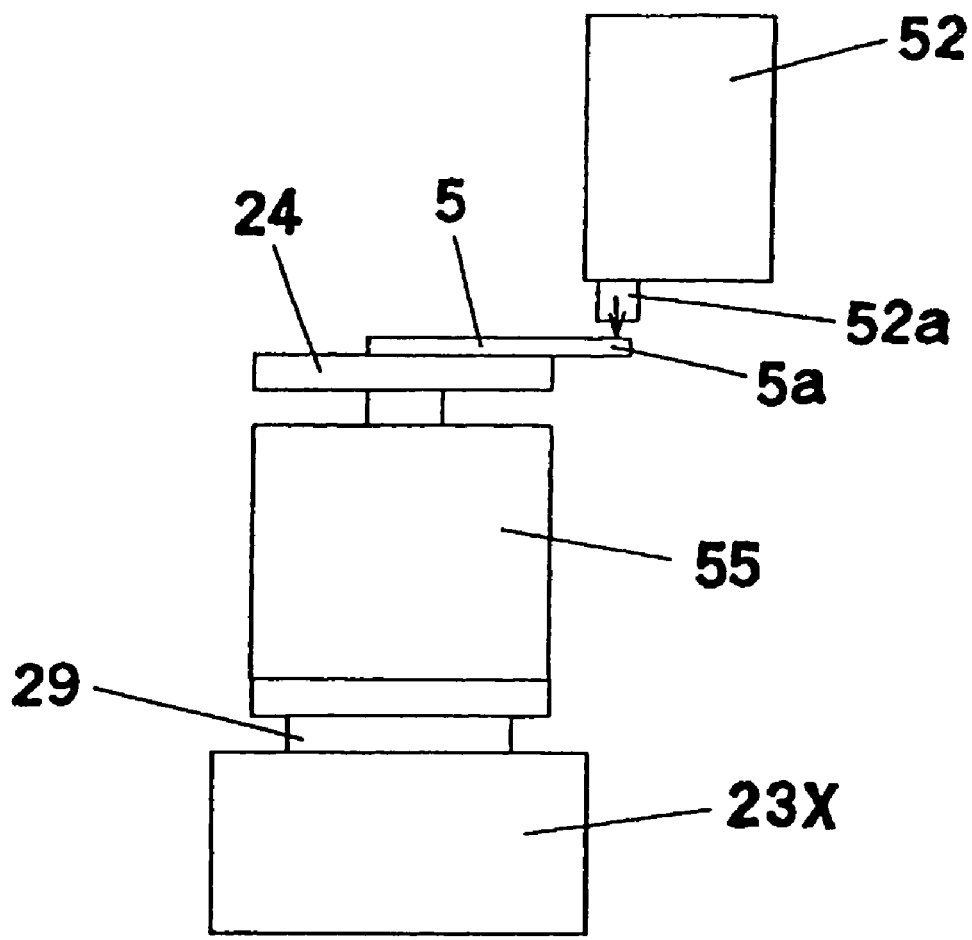
FIG. 3 is a sectional view of a first cleaning portion of the terminal cleaning apparatus according to an embodiment of the invention.

Next, a structure of the first cleaning portion 21 will be explained in reference to FIG. 3. FIG. 3 shows an A-A section of FIG. 2. In FIG. 3, a first elevation mechanism 55 is coupled onto the X-axis table 23X via the common supporting member 29 and the first elevation mechanism 55 moves up and down the substrate holding portion 24. By driving the XY table mechanism 23 and the first elevation mechanism 55, the edge portion 5a of the substrate 5 held on the first substrate holding portion 24 can be positioned to a plasma nozzle portion 52a of the atmospheric pressure plasma cleaning portion 52 in the horizontal direction and the vertical direction.

The atmospheric pressure plasma cleaning portion 52 is provided with a plasma generating apparatus for generating a plasma by applying a voltage to a gas passing inside of a gas supply pipe under the atmospheric pressure condition and the generated plasma is injected from the plasma nozzle portion 52a to a lower side. By moving the substrate 5 in X direction by driving the X-axis table 23X while injecting plasma to the edge portion 5a, a portion of the edge portion 5a to be cleaned is cleaned by the atmospheric pressure plasma to remove a foreign matter on a surface of the edge portion 5a.

The first ultrasonic air blow cleaning portion 51 is provided with a vibration generating apparatus for applying ultrasonic vibration to air passing through an air blow pipe which removes a foreign matter on the surface of the edge portion 5a by blowing air applied with vibration to the edge portion 5a of the substrate 5 moved in X direction and sucking blown air to exhaust.

Figure 4:
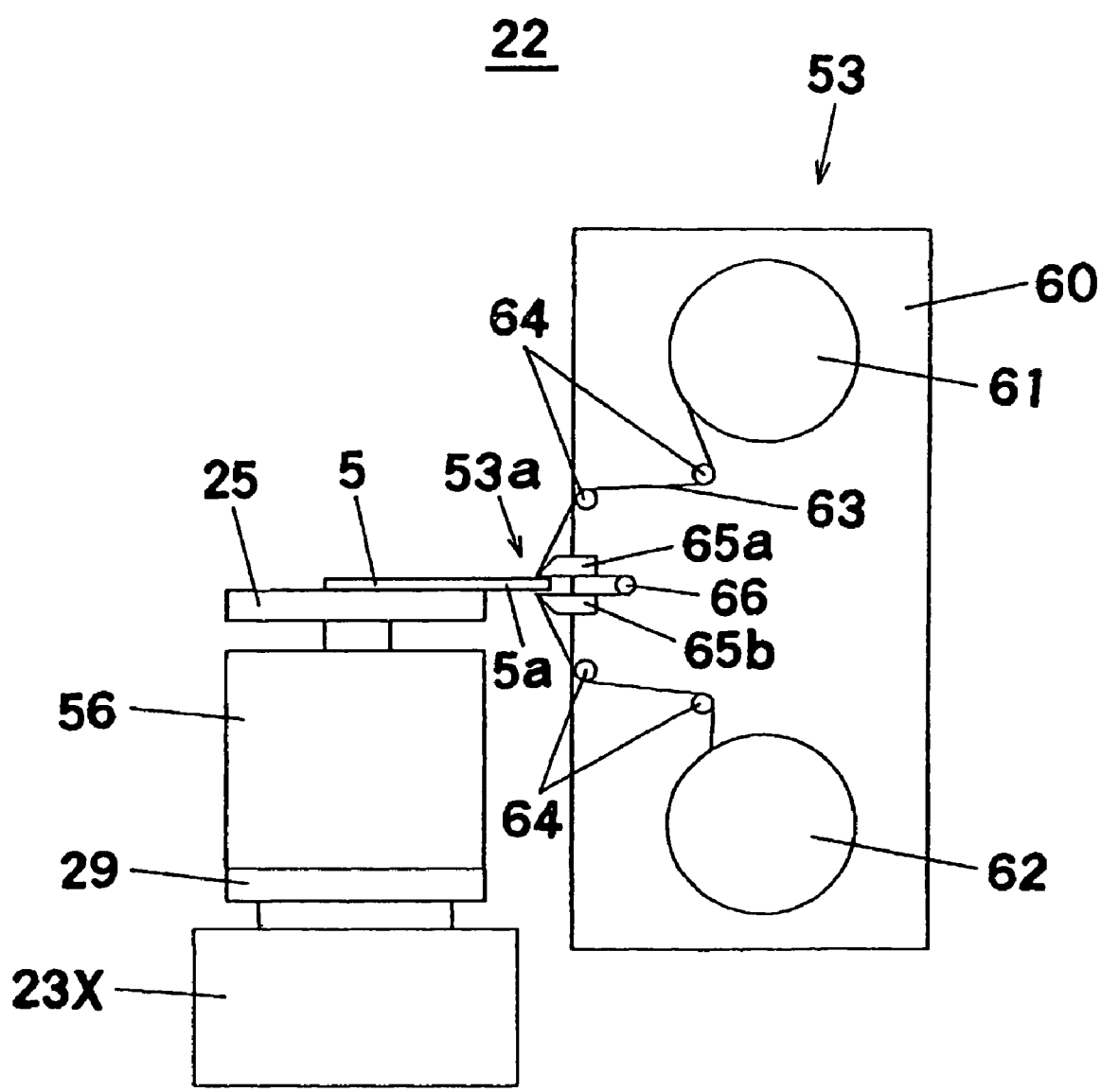
FIG. 4 is a sectional view of a second cleaning portion of the terminal cleaning apparatus according to an embodiment of the invention.

Next, a structure of the second cleaning portion 22 will be explained in reference to FIG. 4. FIG. 4 shows a B-B section of FIG. 2. In FIG. 4, a second moving up and down mechanism 56 is coupled onto the X-axis table 23X via the common supporting member 29 and the second elevation mechanism 56 moves up and down the second substrate holding portion 25. By driving the XY table mechanism 23 and the second elevation mechanism 56, the edge portion 5a of the substrate 5 held on the second substrate holding portion 25 can be positioned to a pinching mechanism 53a of the wiping cleaning portion 53 arranged at the second cleaning portion 22.

The wiping cleaning portion 53 arranged at the second cleaning portion 22 will be explained. The wiping cleaning portion 53 is constructed by a constitution of providing the pinching mechanism 53a for pinching the edge portion 5a of the substrate 5 to wipe to clean by a cleaning tape 63 at a central portion at an end face of a vertical base frame 60 and the pinching mechanism 53a has a pair of pinching members 65a and 65b which can be opened and closed in an up and down direction.

The base frame 60 is provided with a supply reel 61 for supplying the cleaning tape 63 for wiping to clean and a recovery reel 62 for recovering the cleaning tape 63 which has been used. The cleaning tape 63 drawn out from the supply reel 61 is guided by a guide roller 64 and turned around the pinching members 65a and 65b and a fold back guide 66. Thereby, the cleaning tape 63 is guided along two upper and lower faces of the edge portion 5a of the substrate 5 and is reeled by the recovery reel 62 via the guide roller 64.

The cleaning tape 63 is pressed to the two upper and lower faces of the edge portion 5a by closing the pinching members 65a and 65b in a state of moving the edge portion 5a between the pinching members 65a and 65b. Further, by moving the substrate 5 in X direction by driving the X-axis table 23X under the state, the portion of the edge portion 5a to be cleaned provided with the externally connecting terminal is wiped to clean by the cleaning tape 63. Further, the substrate 5 which has been wiped to clean is cleaned by the second ultrasonic air blow cleaning portion 54 having a constitution similar to that of the first ultrasonic air blow cleaning portion 51.

That is, the terminal cleaning portion 2 having the above-described constitution is constructed by a constitution of arranging the atmospheric pressure plasma cleaning portion 52 for cleaning by the plasma at the first cleaning portion 21 and arranging the wiping cleaning portion 53 for cleaning to wipe at the second cleaning portion 22. Further, an ultraviolet ray cleaning portion for cleaning by ozone generated by ultraviolet ray may be arranged in place of the atmospheric pressure plasma cleaning portion 52.

Figure 5:
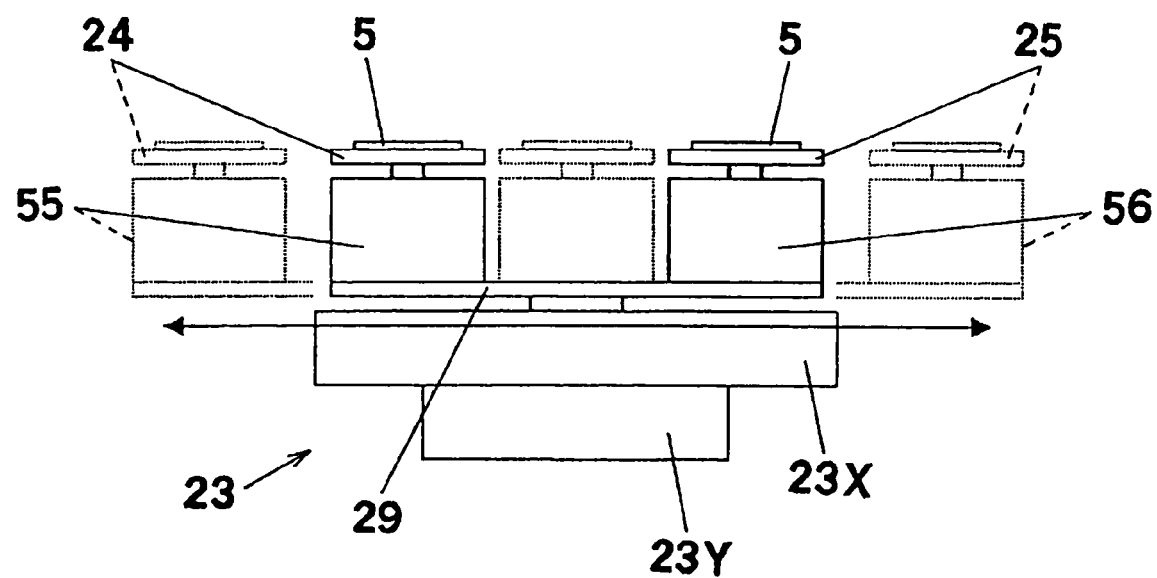
FIG. 5 is a sectional view of a substrate holding portion moving mechanism of the terminal cleaning apparatus according to an embodiment of the invention.

Next, an explanation will be given of movement of the first substrate holding portion 24 and the second substrate holding portion 25 in the terminal cleaning apparatus 2. FIG. 5 shows a view viewing FIG. 2 from a line C-C. In FIG. 5, the X-axis table 23X constituting the XY table mechanism 23 is coupled with the first elevation mechanism 55 and the second elevation mechanism 56 via the common supporting member 29. The first elevation mechanism 55 and the second elevation mechanism 56 respectively move up and down the first substrate holding portion 24 and the second substrate holding portion 25.

By driving the X-axis table 23X, the substrates 5 respectively held by the first substrate holding portion 24 and the second substrate holding portion 25 are simultaneously moved in X direction. Thereby, relative movement of the substrate 5 held by the first substrate holding portion 14 relative to the first cleaning portion 21 and relative movement of the substrate 5 held by the second substrate holding portion 25 relative to the second cleaning portion 22 can be carried out by the single XY table mechanism 23.

Figure 6:
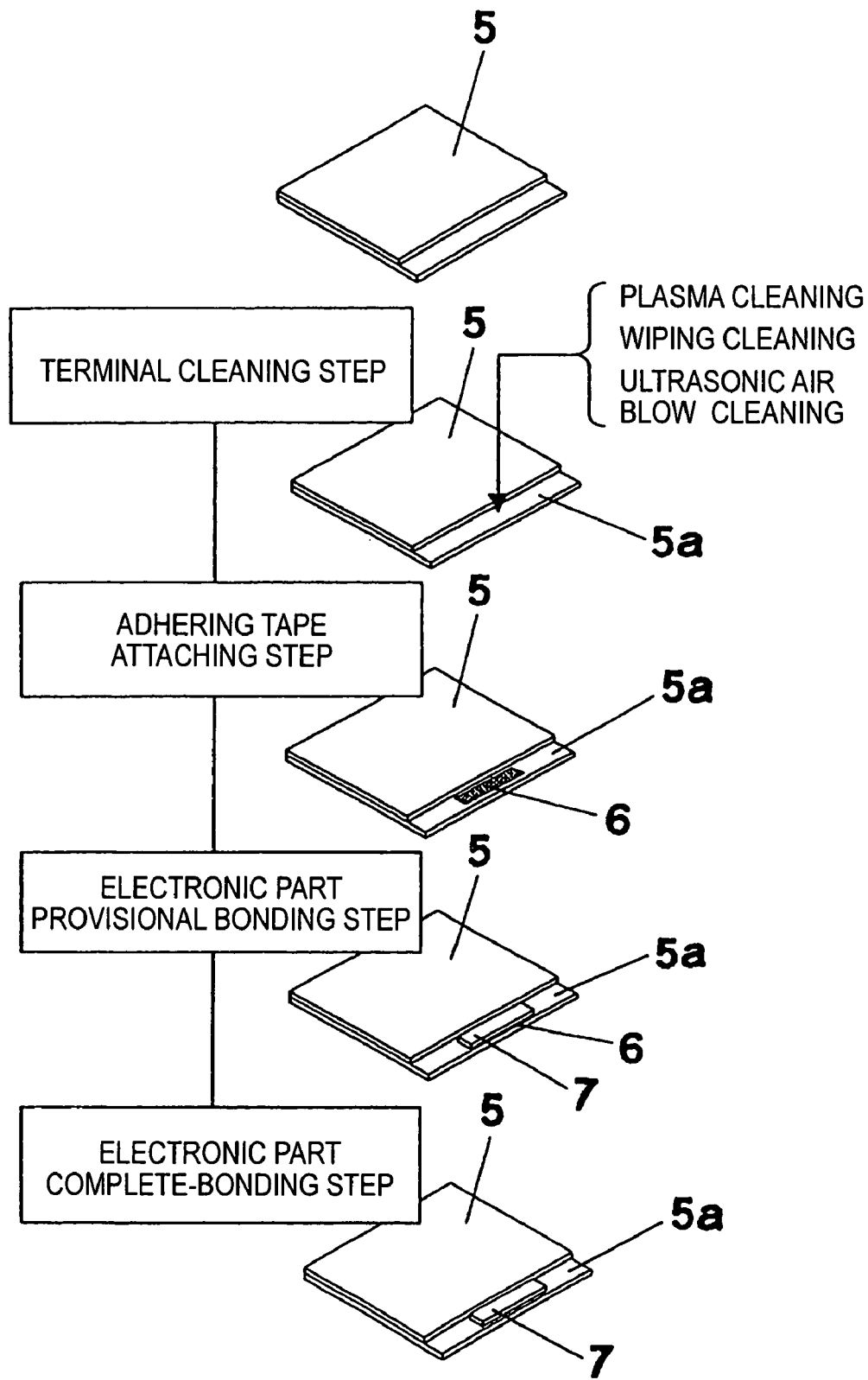
FIG. 6 is an explanatory view of a procedure of integrating a display panel by the assembling apparatus according to the first embodiment of the invention.

Next, an explanation will be given of an assembling method of integrating a display panel by bonding an electronic part to a terminal of a display panel in reference to FIG. 6. As shown by FIG. 6, the assembling method is constituted by a terminal cleaning step of cleaning the externally connecting terminal provided at the edge portion 5a of the substrate 5, an adhering tape attaching step of attaching the ACF tape 6 which is the adhering tape to the terminal cleaned by the terminal cleaning step, and an electronic part bonding step of bonding the electronic part 7 to the substrate 5 in a state of pressing the electrode (not illustrated) of the electronic part 7 from above the ACF tape 6 pasted to the substrate 5 and electrically conducting the electrode and the terminal.

Figure 7:
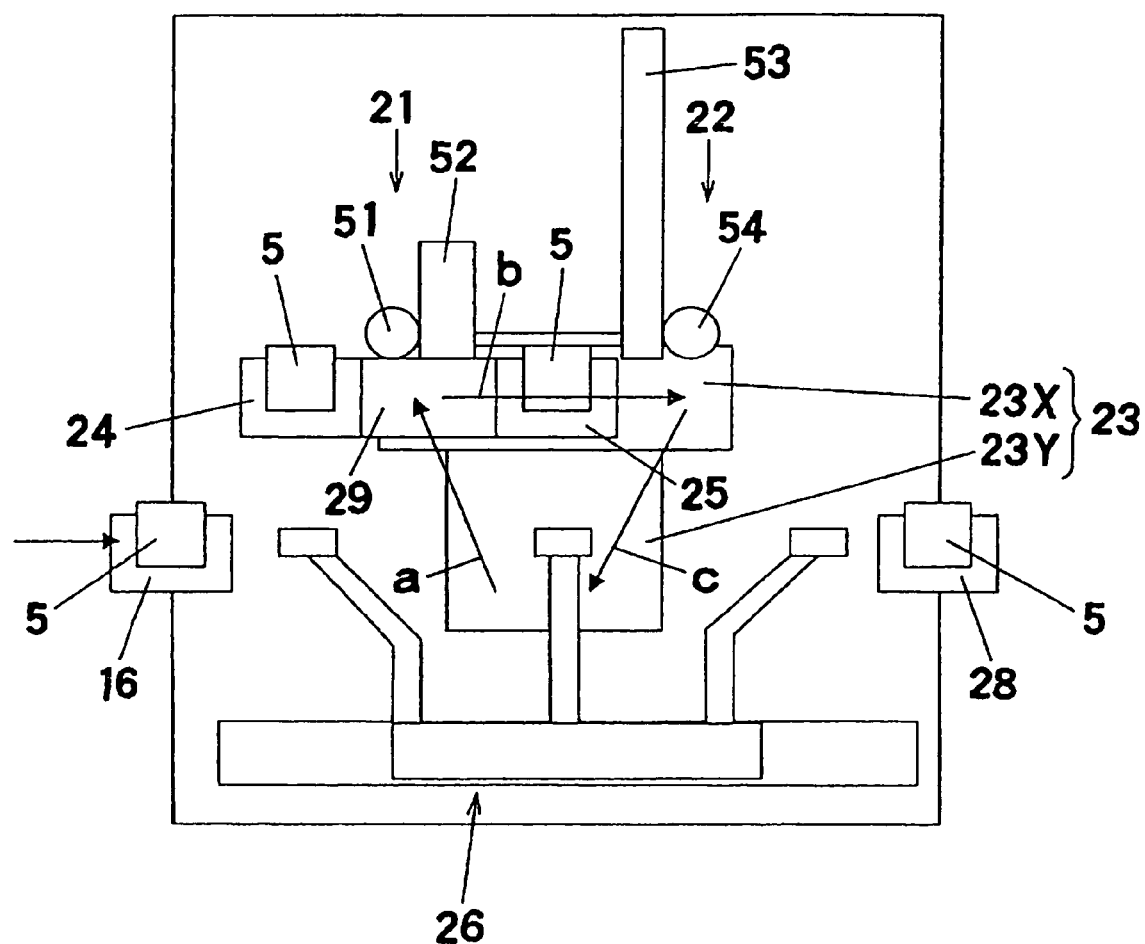
FIG. 7 is an operation explanatory view of a terminal cleaning operation by the terminal cleaning apparatus according to the embodiment of the invention.

An explanation will be given of operation of carrying the substrate 5 in the terminal cleaning step carried out in the above-described procedure of assembling the display panel with reference to FIGS. 7 to 9. FIG. 7 shows operation of moving the substrates in cleaning, that is, movement of the substrates 5 in cleaning the substrates 5 respectively held by the first substrate holding portion 24 and the second substrate holding portion 25 respectively by the first cleaning portion 21 and the second cleaning portion 22. In a state of starting the operation, the substrate 5 which is not cleaned is carried in from the upstream side to the supply standby stage 16, the substrate 5 which is not cleaned is held by the first substrate holding portion 24, and the substrate 5 which has been finished to clean by the first cleaning portion 21 is held by the second substrate holding portion 25, respectively. Further, the substrate 5 which has been finished to clean is mounted on the intermediate standby stage 28.

First, by driving the XY table mechanism 23, the first substrate holding portion 24 and the second substrate holding portion 25 disposed at substrate delivery positions at an interval from the first substrate carrying mechanism 26 are moved in an arrow mark a direction to respectively dispose the substrate 5 held by the first substrate holding portion 24 on this side of the first cleaning portion 21 and dispose the substrate 5 held by the second substrate holding portion 25 on this side of the second cleaning portion 22. Thereby, cleaning by the first cleaning portion 21 and the second cleaning portion 22 has been prepared.

Successively, the first substrate holding portion 24 and the second substrate holding portion 25 are moved in X direction (arrow mark b direction) by driving the X-axis table 23X and in the moving procedure, the substrate 5 held by the first substrate holding portion 24 is made to pass the first cleaning portion 21 to clean the substrate by the first cleaning portion 21 and the substrate 5 held by the second substrate holding portion 25 is made to pass the second cleaning portion 22 to clean the substrate by the second cleaning portion 22.

When cleaning has been finished, there is carried out returning operation of moving the first substrate holding portion 24 and the second substrate holding portion 25 to the substrate delivery positions at the interval from the first substrate carrying mechanism 26 (arrow mark c direction). Further, the substrate 5 which has been finished to clean by the second cleaning portion 22 is carried out from the second substrate holding portion 25, the substrate 5 which has been finished to clean by the first cleaning portion 21 is transferred from the first substrate holding portion 24 to the second substrate holding portion 25 and the substrate 5 which is not cleaned is transferred to the first substrate holding portion 24.

Figure 8:
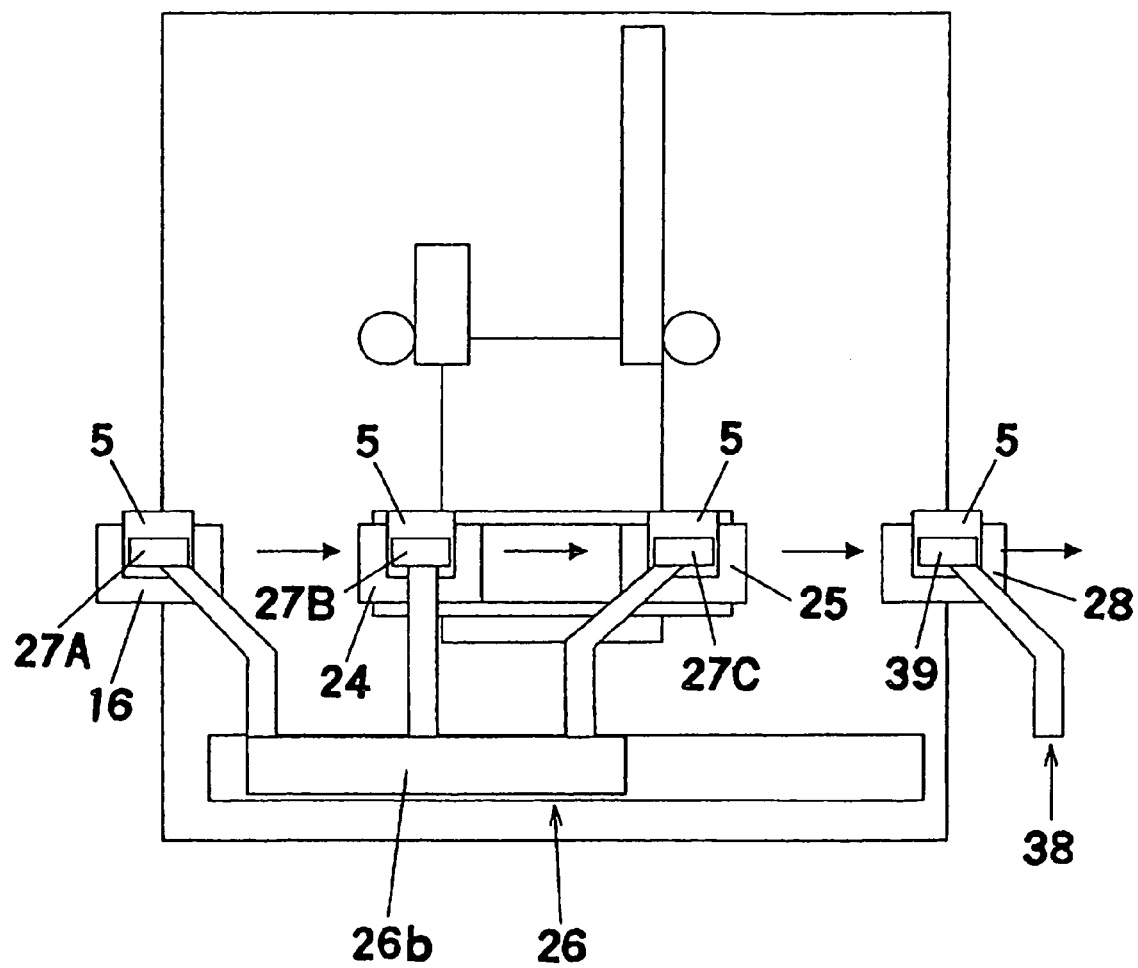
FIG. 8 is an operation explanatory view of a terminal cleaning operation by the terminal cleaning apparatus according to the embodiment of the invention.

That is, first, as shown by FIG. 8, the sliding portion 26b is moved to the upstream side (left side) and the substrate 5 which is not cleaned on the supply standby stage 16, substrate 5 which has been finished to clean by the first cleaning portion 21 on the first substrate holding portion 24 and the substrate 5 which has been finished to clean by the second cleaning portion 22 on the substrate holding portion 25 are respectively held by the three substrate holding heads 27A, 27B, 27C successively from the left side.

Figure 9:
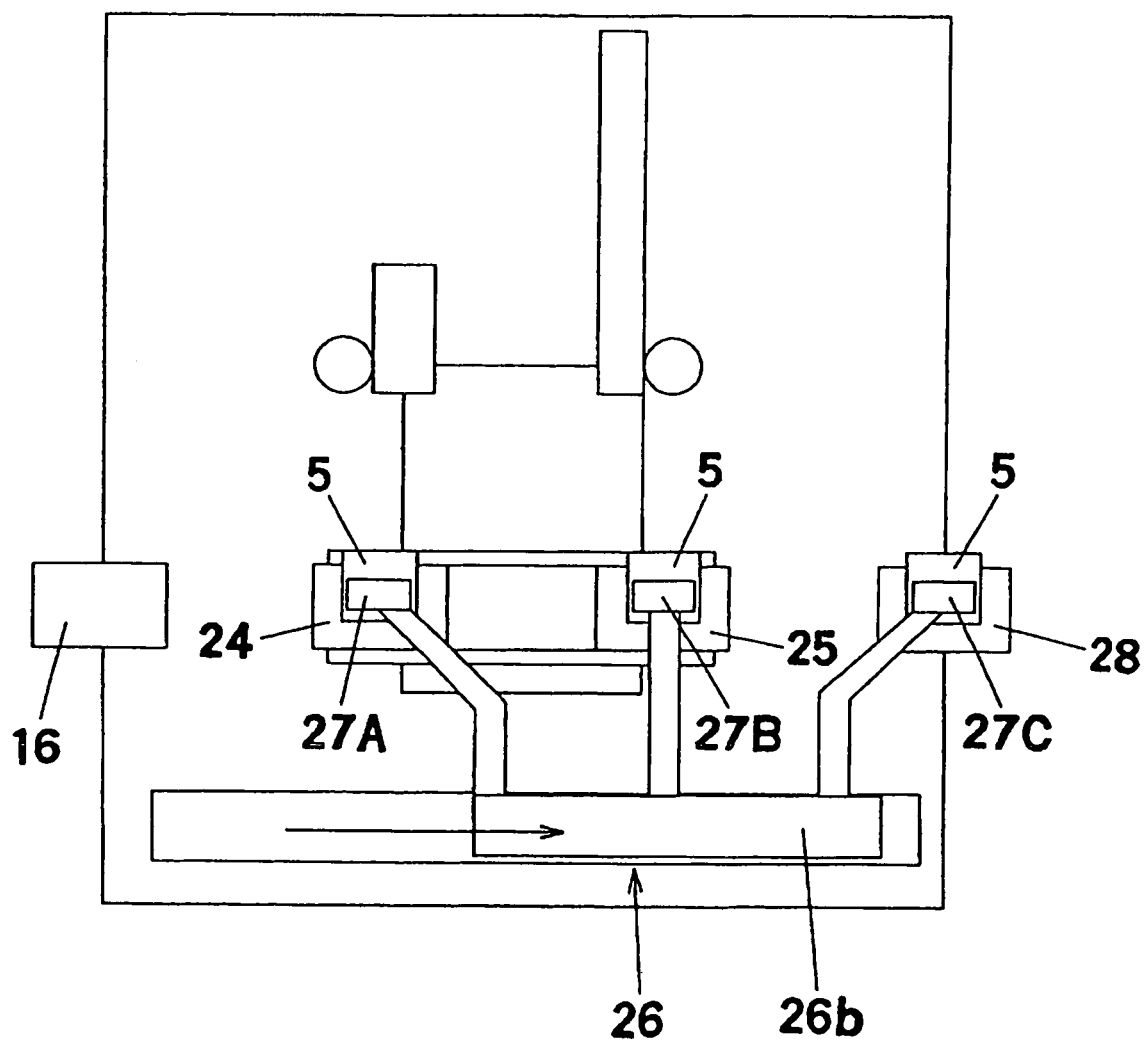
FIG. 9 is an operation explanatory view of a terminal cleaning operation by the terminal cleaning apparatus according to the embodiment of the invention.

Next, as shown by FIG. 9, the sliding portion 26b is moved to the downstream side (right side), the substrate 5 which is not cleaned is moved from the supply standby stage 16 to the first substrate holding portion 24, the substrate 5 which has been finished to clean by the first cleaning portion 21 is moved from the first substrate holding portion 24 to the second substrate holding portion 25, and the substrate 5 which has been finished to clean by the second cleaning portion 24 is moved from the second substrate holding portion 25 to the intermediate standby stage 28, respectively.

That is, according to the substrate carrying operation, operation of passing the substrate 5 held by the first substrate holding portion 24 through the cleaning portion 21, and operation of passing the substrate 5 held by the second substrate holding portion 25 through the second cleaning portion 22 are simultaneously carried out, and operation of carrying out the substrate which has been finished to clean from the second substrate holding portion 25, operation of transferring the substrate 5 which has been finished to clean by the first cleaning portion 21 from the first substrate holding portion 24 to the second substrate holding portion 25, and operation of transferring the substrate 5 which is not cleaned to the first substrate holding portion 24 are carried out simultaneously. Thereby, the substrate carrying operation can be carried out efficiently and the operational efficiency of the terminal cleaning step can be improved.

Figure 10:
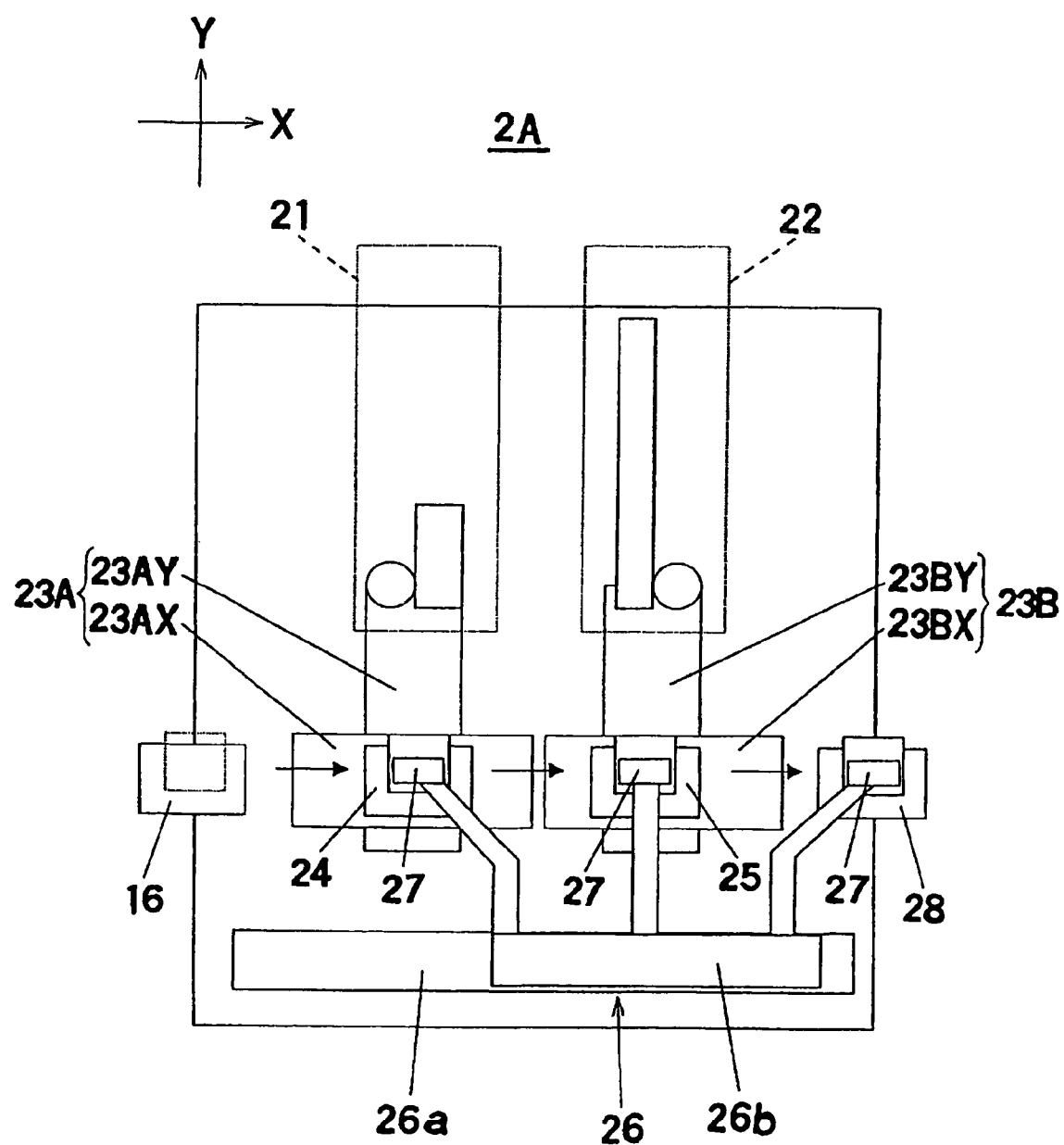
FIG. 10 is a plane view of a terminal cleaning apparatus according to an embodiment of the invention.

Further, although according to the above-described embodiment, there is shown a constitution example of coupling the first substrate holding portion 24 and the second substrate holding portion 25 to the XY table mechanism 23 via the common supporting member 29 and moving the first substrate holding portion 24 and the second substrate holding portion 25 integrally by the XY table mechanism 23, a constitution shown by FIG. 10 may be adopted.

In FIG. 10, the terminal cleaning apparatus 2 is provided with the first cleaning portion 21 and the second cleaning portion 22 similar to those of FIG. 2 to carry out cleaning by constituting an object by the substrates 5 respectively by the first substrate holding portion 24 and the second substrate holding portion 25. Here, the first substrate holding portion 24 is moved by an XY table mechanism 23A comprising an X-axis table 23AX and a Y-axis table 23AY, and the second substrate holding portion 25 is moved by an XY table mechanism 23B comprising an X-axis table 23BX and a Y-axis table 23BY.

That is, in the above-described constitution, a substrate holding portion moving means is constituted by a first substrate holding portion moving mechanism for moving the first substrate holding portion 24 and a second substrate holding portion moving mechanism for moving the second substrate holding portion 25 and the first substrate holding portion moving mechanism and the second substrate holding portion moving mechanism are constituted by the respectively individual XY table mechanisms 23A and 23B. By adopting such a constitution, moving speeds for relatively moving the substrates 5 relative to the first cleaning portion 21 and the second cleaning portion 22 can be individually set to speeds suitable for respective cleaning methods adopted by the first cleaning portion 21 and the second cleaning portion 22 and further excellent cleaning quality can be ensured.

Figure 11:
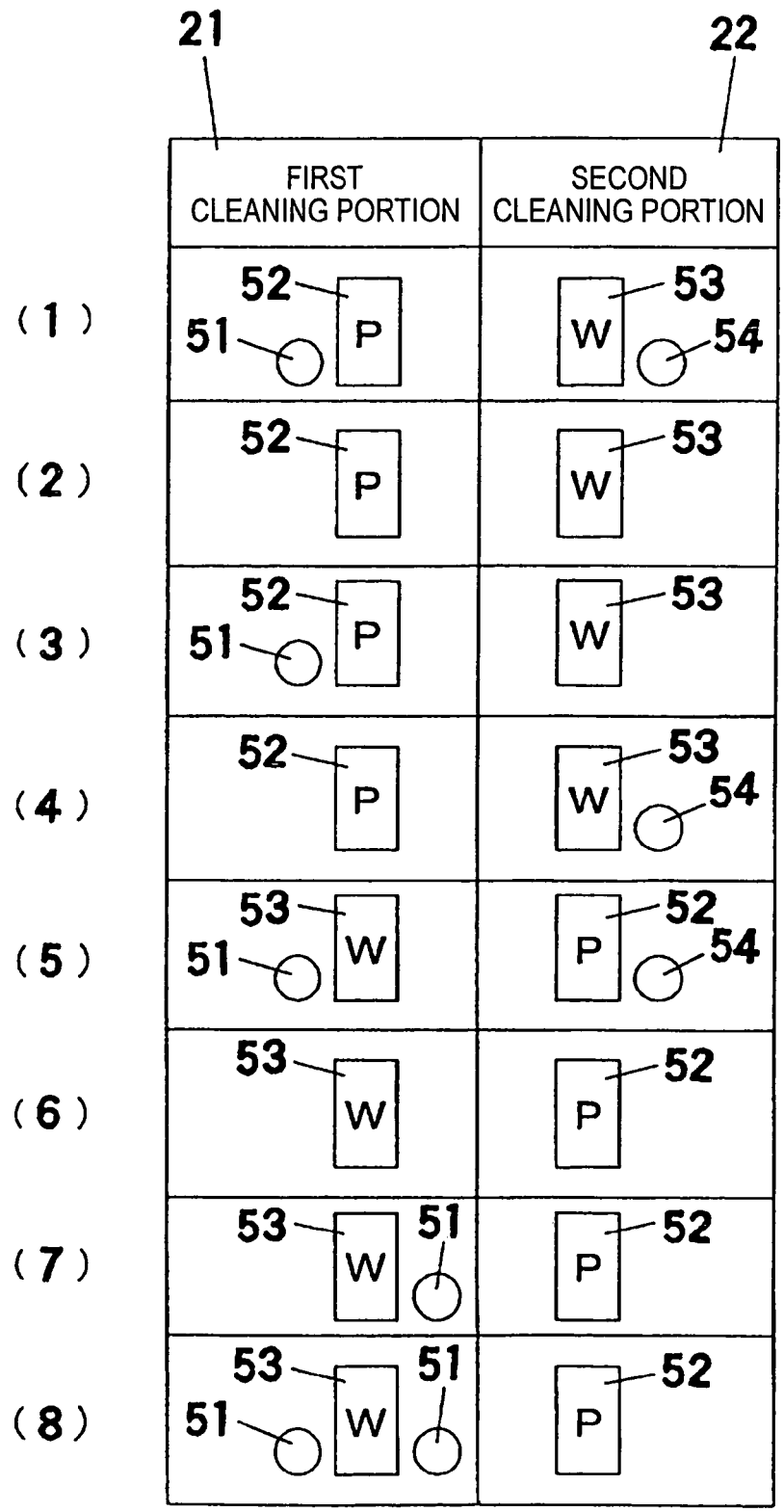
FIG. 11 is an explanatory view of patterns of constituting cleaning portions of the terminal cleaning apparatus according to the embodiment of the invention.

Further, FIG. 11 shows examples of combining cleaning systems applicable to the first cleaning portion 21 and the second cleaning portion 22. (1) shows the constitution shown in FIG. 2. (2) shows a constitution in which the first ultrasonic air blow cleaning portion 51 and the second ultrasonic air blow cleaning portion 54 are respectively excluded from the first cleaning portion 21 and the second cleaning portion 22 in the constitution of (1). Further, (3) shows a constitution in which the second ultrasonic air blow cleaning portion 54 is excluded from the second cleaning portion 22 in the constitution of (1) and (4) shows a constitution in which the first ultrasonic air blow cleaning portion 51 is excluded from the first cleaning portion 21 in the constitution of (1).

Further, (5), (6), (7), (8) show constitutions in which orders of aligning the atmospheric pressure plasma cleaning portion 52 and the wiping cleaning portion 53 are reversed from those of constitution examples shown in (1), (2), (3), (4). That is, in the case of (5), (6), (7), (8), there is constructed a constitution of arranging the wiping cleaning portion 53 to the first cleaning portion 21 and arranging the atmospheric pressure plasma cleaning portion 52 to the second cleaning portion 22. Further, (5) shows a constitution example of arranging the first ultrasonic air blow cleaning portion 51 and the second ultrasonic air blow cleaning portion 54 respectively to the first cleaning portion 21 and the second cleaning portion 22 and (6) shows a constitution example in which the first ultrasonic air blow cleaning portion 51 and the second ultrasonic air blow cleaning portion 54 are not arranged to either of the first cleaning portion 21 and the second cleaning portion 22.

Further, (7) shows an example of arranging the first ultrasonic air blow cleaning portion 51 only to the first cleaning portion 21 and FIG. (8) shows an example of arranging the first ultrasonic air blow cleaning portions 51 respectively to before and after the wiping cleaning portion 53 used for the first cleaning portion 21. In this way, various cleaning systems can be combined to the first cleaning portion 21 and the second cleaning portion 22 by different alignments.

That is, the terminal cleaning apparatus 2 can be set with various variations of a constitution of arranging the wiping cleaning portion 53 for wiping to clean to the first cleaning portion 21 and arranging the atmospheric pressure plasma cleaning portion 52 for carrying out plasma cleaning to the second cleaning portion 22, a constitution of arranging the ultraviolet ray cleaning portion for cleaning by ozone generated by ultraviolet ray to the first cleaning portion 21 and arranging the wiping cleaning portion 53 for wiping to clean to the second cleaning portion 22, a constitution of arranging the wiping cleaning portion 53 for wiping to clean to the first cleaning portion 21 and arranging the ultraviolet ray cleaning portion for carrying out cleaning by ozone generated by ultraviolet ray to the second cleaning portion 22 and the like other than the example shown in FIG. 2.

The assembling apparatus, the assembling method and the terminal cleaning method of the invention achieve an effect of capable of shortening cycle time of integrating operation by improving the operational efficiency of the step of cleaning the externally connecting terminal and can be utilized in the field of bonding the electronic part to the substrate of the liquid crystal panel or the like to integrate.

What is claimed is:

1. An assembling method comprising:
    a terminal cleaning step of cleaning an externally connecting terminal of a substrate;
    an adhering tape attaching step of attaching an adhering tape to the terminal cleaned by the terminal cleaning step; and
    an electronic part bonding step of pressing an electrode of an electronic part from above the adhering tape attached to the substrate to bond the electronic part to the substrate in a state of electrically conducting the electrode and the terminal;
    wherein in the terminal cleaning step,
    the substrates are held by a first substrate holding portion and a second substrate holding portion arranged at a position remote from the first substrate holding portion in a first direction, whereby the substrates are simultaneously moved in the first direction and positioned in the first and second substrate holding portions, respectively,
    the substrate held by the first substrate holding portion is made to pass through the first cleaning portion to clean the substrate by the first cleaning portion,
    the substrate held by the second substrate holding portion is made to pass through the second cleaning portion to clean the substrate by the second cleaning portion,
    the substrate cleaned by the second cleaning portion is carried out from the second substrate holding portion, the substrate cleaned by the first cleaning portion is transferred from the first substrate holding portion to the second substrate holding portion, and
    the substrate which is not cleaned is transferred to the first substrate holding portion,
    wherein the first substrate holding portion and the second substrate holding portion are provided above a substrate holding portion moving means, and
    wherein the first and second substrate holding portions are moved in a horizontal direction to pass through the first and second cleaning portions, respectively by the substrate holding portion moving means.

2. The assembling method according to claim 1, wherein an operation of passing the substrate held by the first substrate holding portion through the first cleaning portion and an operation of passing the substrate held by the second substrate holding portion through the second cleaning portion are carried out simultaneously.

3. The assembling method according to claim 1, wherein an operation of carrying out the substrate cleaned by the second cleaning portion from the second substrate holding portion, an operation of transferring the substrate cleaned by the first cleaning portion from the first substrate holding portion to the second substrate holding portion, and an operation of transferring the substrate which is not cleaned to the first substrate holding portion are carried out simultaneously.

4. The assembling method according to claim 1, wherein the first cleaning portion has an atmospheric pressure plasma cleaning portion for carrying out plasma cleaning and the second cleaning portion has a wiping cleaning portion for carrying out wiping cleaning.

5. The assembling method according to claim 1, wherein the first cleaning portion has a wiping cleaning portion for carrying out wiping cleaning and the second cleaning portion has an atmospheric pressure plasma cleaning portion for carrying out plasma cleaning.

6. The assembling method according to claim 1, wherein the first cleaning portion has an ultraviolet ray cleaning portion for carrying out cleaning by ozone generated by ultraviolet ray and the second cleaning portion has a wiping cleaning portion for carrying out wiping cleaning.

7. The assembling method according to claim 1, wherein the first cleaning portion has a wiping cleaning portion for carrying out wiping cleaning and the second cleaning portion has an ultraviolet ray cleaning portion for carrying out cleaning by ozone generated by the ultraviolet ray.

8. The assembling method according to claim 1, wherein the substrate holding portion moving means is a single substrate holding portion moving mechanism and the first substrate holding portion and the second substrate holding portion are attached via a common supporting member moved by the substrate holding portion moving mechanism.

9. The assembling method according to claim 8, wherein the common supporting member is moved horizontally by the substrate holding portion moving mechanism.

10. The assembling method according to claim 8, wherein the substrate holding portion moving mechanism is an XY table mechanism.

11. The assembling method according to claim 10, wherein the XY table mechanism comprises an X-axis table and a Y-axis table, and the first and second substrate holding portions are moved in a Y direction toward the first and second cleaning portions, respectively by the Y-axis table, and are moved in a X direction which is orthogonal to the Y direction by the X-axis table.

\* \* \* \* \*